US005568091A

United States Patent [19]
Ramalho et al.

[11] Patent Number: 5,568,091
[45] Date of Patent: Oct. 22, 1996

[54] DIFFERENTIAL AMPLIFIER WITH COMMON-MODE REJECTION FOR LOW SUPPLY VOLTAGES

[75] Inventors: Joao N. V. L. Ramalho; Johannes O. Voorman, both of Eindhoven, Netherlands

[73] Assignee: U.S. Philips Corporation, New York, N.Y.

[21] Appl. No.: 490,824

[22] Filed: Jun. 15, 1995

[30] Foreign Application Priority Data

Jun. 15, 1994 [EP] European Pat. Off. .............. 94201714

[51] Int. Cl.⁶ .................................................. H03F 3/45
[52] U.S. Cl. .......................................... 330/258; 330/257
[58] Field of Search ................................. 330/252, 253, 330/257, 258, 261

[56] References Cited

U.S. PATENT DOCUMENTS

| | | | |
|---|---|---|---|
| 4,267,517 | 5/1981 | Iida et al. | 330/258 X |
| 5,032,797 | 7/1991 | Mijuskovic | 330/253 |
| 5,361,040 | 11/1994 | Barrett | 330/258 X |

OTHER PUBLICATIONS

IEEE Journal of Solid–State Circuits, vol. 23, No. 3, Jun. 1988; pp. 750–758, "A 4–MHz CMOS Continous–Time Filter with On–Clip Automatic Tuning", by Krummenacher et al.

*Primary Examiner*—Steven Mottola
*Attorney, Agent, or Firm*—Bernard Franzblau

[57] ABSTRACT

A differential amplifier with common-mode rejection for low supply voltages has a first and a second differential pair without transistors in the tails of the differential pairs and with proportional common-mode currents flowing through the first and the second differential pair. The differential amplifier includes a current mirror which feeds the common-mode current of the second differential pair (3, 4) back to the output terminals of the first differential pair for the rejection of common-mode currents at the output terminals. The voltage at the output terminals of the current mirror has a d.c. level which can be established by means of a first reference voltage source independently of the common-mode voltage at the input terminals of the differential amplifier.

11 Claims, 3 Drawing Sheets

2

DIFFERENTIAL AMPLIFIER WITH COMMON-MODE REJECTION FOR LOW SUPPLY VOLTAGES

BACKGROUND OF THE INVENTION

This invention relates to a differential amplifier with common-mode rejection, comprising a first through fourth transistor, each having a first main electrode, a second main electrode and a control electrode, the differential amplifier further comprising a current mirror having an input terminal, a first output terminal and a second output terminal, in which:

the first and the third transistor each have their control electrodes coupled to a first input terminal of the differential amplifier, the second and the fourth transistor each have their control electrodes coupled to a second input terminal of the differential amplifier, the first through the fourth transistor have their second main electrodes coupled to a first supply terminal, the first and the second transistor have their first main electrodes coupled, respectively, to the first and the second output terminal of the current mirror, and the third and the fourth transistor have their first main electrodes coupled to the input terminal of the current mirror.

Such a differential amplifier is known, inter alia from U.S. Pat. No. 5,032,797. In this known differential amplifier the first and the second transistor and the third and the fourth transistor form a first differential pair and a second differential pair, respectively, which first differential pair has its output terminals coupled to the output terminals of a current mirror and which second differential pair has its output terminals coupled to an input terminal of the current mirror. The second differential pair in conjunction with the current mirror provides common-mode rejection at the output terminals of the first differential pair, which output terminals form the output terminals of the differential amplifier. However, in the known differential amplifier the tails of the differential pairs each include a transistor for transconductance control of the differential pairs.

A drawback of such a transconductance control is that a voltage drop is produced across said transistor. This is not favourable for use at low supply voltages. However, when the transistors in the tails of the differential pairs are omitted the d.c. level at the output terminals of the differential amplifier will become dependent on the common-mode current because this current is no longer maintained substantially constant by the transistor in the tail of the second differential pair.

SUMMARY OF THE INVENTION

It is an object of the invention to provide a differential amplifier with common-mode rejection suitable for use at low supply voltages.

To this end, according to the invention, the differential amplifier with common-mode rejection of the type defined in the opening paragraph is characterised in that the current mirror comprises a fifth through tenth transistor, each having a first main electrode, a second main electrode and a control electrode, the fifth, the sixth and the seventh transistor having their first main electrodes coupled, respectively, to the first output terminal, the second output terminal and the input terminal of the current mirror, having their second main electrodes coupled to the first main electrodes of the eighth, the ninth and the tenth transistor, respectively, and having their control electrodes coupled to the first main electrode of the seventh transistor, the eighth, the ninth and the tenth transistor have their second main electrodes coupled to a second supply terminal, the eighth and the ninth transistor have their control electrodes coupled, respectively, to the first and the second output terminal of the current mirror, the tenth transistor having its control electrode coupled to a first reference voltage source for generating a first reference voltage, the eighth transistor having its first main electrode coupled to the first main electrode of the ninth transistor.

Such a current mirror is known per se from the IEEE Journal of Solid-State Circuits, vol. 23, no. 3, June 1988, pages 750–758, FIG. 2, in which, however, a constant current is applied to the input of the current mirror instead of a common-mode current of the third and a fourth transistor.

In accordance with the invention the differential amplifier with common-mode rejection of the type defined in the opening paragraph may also be characterised in that the current mirror comprises a fifth through twelfth transistor, each having a first main electrode, a second main electrode and a control electrode, the fifth, the sixth and the seventh transistor having their first main electrodes coupled, respectively, to the first output terminal, the second output terminal and the input terminal of the current mirror, having their second main electrodes coupled to the first main electrodes of the eighth, the ninth and the tenth transistor, respectively, and having their control electrodes coupled to the first main electrode of the seventh transistor, the eighth, the ninth, the tenth, the eleventh and the twelfth transistor have their second main electrodes coupled to a second supply terminal, the eighth and the ninth transistor have their control electrodes coupled, respectively, to the first and the second output terminal of the current mirror, the tenth transistor having its control electrode coupled to a first reference voltage source for generating a first reference voltage, the eleventh and the twelfth transistor having their control electrodes coupled to the control electrodes of the eighth and the ninth transistor, respectively, and the eleventh and the twelfth transistor having their first main electrodes coupled to the second main electrodes of the sixth and the fifth transistor, respectively.

The invention is based on the recognition of the fact that as a result of the use of a current mirror, which enables the control electrode of the tenth transistor to be biased with a reference voltage, the voltage on the output terminals of the differential amplifier will follow said reference voltage when the difference voltage between the input terminals of the differential amplifier is zero. Since the transconductance of the first through the fourth transistor depends on the voltage difference between the first and the second main electrodes the value of the transconductance can be set by means of the reference voltage. With these measures it is possible to dispense with the transistors in the tails of the differential pairs and thus to provide a differential amplifier suitable for use at lower supply voltages.

An embodiment of the differential amplifier in accordance with the invention is characterised in that the first main electrode of the first transistor is coupled to the first output terminal via a main current path of a first cascode transistor, the first main electrode of the second transistor is coupled to the second output terminal via a main current path of a second cascode transistor, the first main electrodes of the third and the fourth transistor are coupled to the input terminal of the current mirror via a main current path of a third cascode transistor, and in that the differential amplifier comprises means for supplying respective bias voltages to the control electrodes of the first, the second and the third cascode transistor. By cascoding the first, the second and the third and the fourth transistor with the first, the second and the third cascode transistor the voltage difference between the first and the second main electrode of the first through the fourth transistor can be maintained constant. By operating the first through the fourth transistor in their triode regions the transconductance of these transistors is directly proportional to the voltage difference between the first and the second main electrode, which voltage difference is established by the means for supplying respective bias voltages to the control electrodes of the cascode transistors. This yields a simple linearised transconductor suitable for low supply voltages.

A simple embodiment of such a differential amplifier in accordance with the invention is characterised in that the means for supplying respective bias voltages to the control electrodes of the first, the second and the third cascode transistor comprise a second reference voltage source, which is coupled to the control electrodes of the first, the second and the third cascode transistor.

An embodiment of a differential amplifier in accordance with the invention, in which said means include feedback, is characterised in that the means for supplying respective bias voltages to the control electrodes of the first, the second and the third cascode transistor comprise a thirteenth, a fourteenth and a fifteenth transistor each having a first main electrode, a second main electrode and a control electrode, the means further comprising a first, a second and a third current source, the first, the second and the third current source being coupled between the second supply terminal and the control electrodes of the first, the second and the third cascode transistor, respectively, the thirteenth, the fourteenth and the fifteenth transistor having their control electrodes coupled to the second main electrodes of the first, the second and the third cascode transistor, respectively, the thirteenth, the fourteenth and the fifteenth transistor having their first main electrodes coupled to the control electrodes of the first, the second and the third cascode transistor, respectively, and the thirteenth, the fourteenth and the fifteenth transistor having second main electrodes coupled to the first supply terminal. The feedback maintains the voltage between the first and the second main electrode of the first through the fourth transistor accurately constant, which results in an improved linearity of the differential amplifier.

BRIEF DESCRIPTION OF THE DRAWINGS

The invention will now be described in more detail with reference to the accompanying drawings. In the drawings.

DESCRIPTION OF THE PREFERRED EMBODIMENTS

Figure 1:
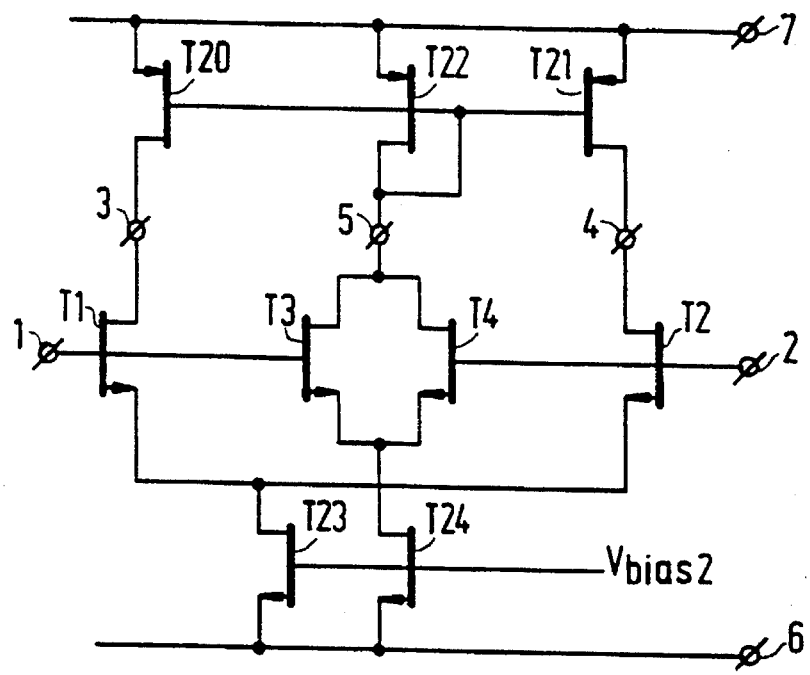
FIG. 1 shows a known differential amplifier with common-mode rejection.

FIG. 1 shows a known differential amplifier with common-mode rejection. The differential amplifier includes a first differential pair comprising transistors T1 and T2 whose second main electrodes or sources are each coupled to the first main electrode or drain of a transistor T23. The transistor T23 has its source coupled to a supply terminal 6 and its control electrode or gate to a voltage Vbias2. The drains of the transistors T1 and T2 are connected to the output terminals 3 and 4, respectively. The gates of the transistors T1 and T2 are connected to input terminals 1 and 2, respectively. The differential amplifier further comprises a second differential pair formed by source-coupled transistors T3 and T4. The gates of the transistors T3 and T4 are connected to the gates of the transistors T1 and T2, respectively. Their common source is coupled to the drain of a transistor T24, which has its source connected to the supply terminal 6 and its gate to the gate of the transistor T23. The drains of the transistors T3 and T4 are both coupled to an input terminal 5 of a current mirror. The current mirror comprises transistors T20, T21, T22, which transistors have their sources coupled to a supply terminal 7. All these transistors have their gates connected to the drain and the gate of a transistor 22, which drain and gate are connected to the input terminal 5 of the current mirror. The outputs of the current mirror are formed by the drains of the transistors T20 and T21, which are coupled to the output terminals 3 and 4. An increased common-mode voltage at the input terminals 1 and 2 will result in an increased current through the transistor 23. This increased current is caused by the finite drain-source resistance of the transistor T23. Moreover, since the common-mode voltage at the input terminals 1 and 2 also appears at the gates of the third and the fourth transistor T3 and T4 of the second differential pair, the current through the transistor T24 will increase to the same extent as the current through the transistor T23. The current through the path formed by the transistor T24 and the parallel arrangement of the transistors T3 and T4 is now fed to the output terminals 3 and 4 of the differential amplifier by means of the current mirror comprising the transistors T20, T21 and T22, as a result of which the output terminals of the differential amplifier are balanced. This provides an effective common-mode rejection. The transconductance of the first and the second differential pair is adjusted by means of the voltage Vbias2. A disadvantage of this is that the transistors T23 and T24 are arranged in series with the first differential pair and the second differential pair, respectively. The voltage drop across the transistors T23 and T24 reduces the voltage swing at the output terminals 3 and 4.

Figure 2:
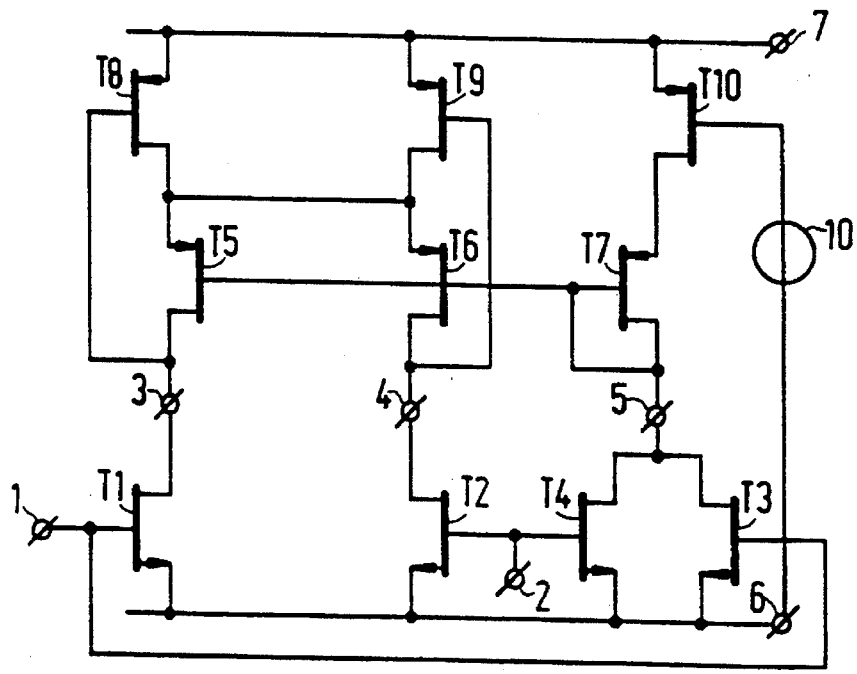
FIG. 2 a shows a first differential amplifier in accordance with the invention, comprising MOS transistors.

FIG. 2 shows a first differential amplifier in accordance with the invention comprising MOS transistors. The transistors T23 and T24 of FIG. 1 are now replaced by a short-circuit. The current mirror of FIG. 1 is replaced by a current mirror comprising transistors T5 through T10. The sources of the transistors T5 and T6 are connected to one another, the node being connected to the supply terminal 7 via a parallel arrangement of two NMOS transistors T8 and T9, having their sources connected to the supply terminal 7, their drains to said node and their gates to the output terminals 3 and 4, respectively. The gates of the transistors T5 and T6 are connected to the source and the gate of the transistor T7. The transistor T10 has its drain connected to the source of the transistor T7, its source to the supply terminal 7 and its gate to a reference voltage source 10. The transistors T5 and T6 are each arranged as a current source, which current source supplies an output current proportional to the input current flowing through the transistor T7. The transistors T5 and T6 form a high-impedance load for the transistors T1 and T2 of the first differential pair. The transistors T8 and T9 function as variable resistors and are operated in the linear region of the characteristic representing the relationship between the drain current and the gate-source voltage, which regions is also referred to as the triode region. A simultaneous increase of the voltage at the output terminals 3 and 4 relative to the supply terminal 7 will result in a simultaneous decrease of the resistance of the transistors T8 and T9. As a result, the voltage at said node will decrease and the effective gate-source voltage of the transistors T5 and T6 will increase, causing the currents through the transistors T5 and T6 to increase. This current increase results in a decrease of the voltage at the output terminals 3 and 4. A change in the common-mode voltage at the output terminals 3 and 4 is thus suppressed. A differential-mode voltage at the output terminals 3 and 4 is not suppressed because an increase of the voltage at, for example, output terminal 3 and a decrease of the voltage at output terminal 4 results in a decrease of the resistance of the transistor T8 and an increase of the resistance of the transistor T9, the parallel resistance of the transistors changing hardly or not at all. The effect of the current mirror is that the output currents at the output terminals 3 and 4 are equal to the input current at input terminal 5. The current mirror operates in such a manner that the drain-source voltages of the transistors T8, T9 and T10 are equal if these transistors have equal areas. As a result, the gate voltage of the transistors T8 and T9 is equal to the gate voltage of the transistor T10. It follows that the d.c. level at the output terminals 3 and 4 is equal to the gate voltage of the transistor T10 and, consequently, is independent of the common-mode voltage at the input terminals 1 and 2. Since the transconductance of the transistors T1 and T2 varies as a function of the drain-source voltage it is also possible to adjust the transconductance of the transistors T1 and T2 by adjusting the gate voltage of the transistor T10, without a bias current being required for this. This is possible in particular if the transistors T1, T2, T3 and T4 are operated in the linear region in which the gate-source voltage is larger than the drain-source voltage. In practice, if the transistors T1, T2, T3 and T4 are not operated in their linear regions, control of the transconductance of the transconductor will nevertheless be obtained in that the input terminals of the transconductor are connected to the output terminals of a preceding transconductor whose d.c. output voltage can be adjusted to control the transconductance of the transistors T1, T2, T3 and T4.

Figure 3:
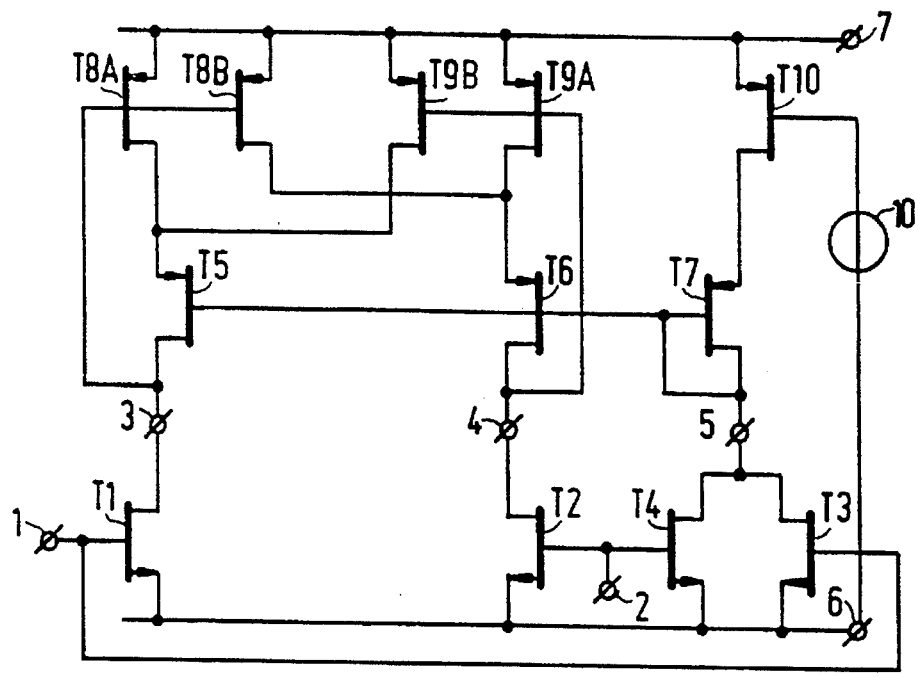
FIG. 3 shows a second differential amplifier in accordance with the invention, comprising MOS transistors.

FIG. 3 shows a second differential amplifier in accordance with the invention, comprising MOS transistors and an improved current mirror. In comparison with FIG. 2, this current mirror comprises additional transistors T8B and T9B whose sources are connected to the supply terminal 7. The gates of the transistors T8B and T9B are connected to the gates of the transistors T8A and T9A, respectively. The drains of the transistors T8B and T9B are connected to the drains of the transistors T9A and T8A, respectively. The coupling between the drains of the transistors T8A and T9A is now severed. The transistors T5 and T6 produce noise currents In5 and In6, which are generated by noise sources parallel to the drain-source current paths of the respective transistors T5 and T6. The magnitude of the noise current In5, inter alia, depends on the impedance seen by the source of the transistor T5. This impedance is equal to Ro5+Rp, where (see FIG. 2):

Ro5 is the output resistance of the transistor T8, and

Rp is the parallel resistance of Ro6 and R89, with:

Ro6 being the output resistance of the transistor T6 and

R89 being the parallel resistance of the transistors T8 and T9.

The output resistances Ro5 and R06 are equal to $1/g_m$ of the transistors T5 and T6, respectively, where $g_m$ is the transconductance of the transistors T5 and T6, respectively. The noise current In5 is partly drained to the supply terminal 7 and for the remainder it flows through the transistor T6, thus producing a differential-mode noise current at the output terminals 3 and 4. A similar effect is brought about by the noise of the transistor T6, the total differential-mode noise current being the sum of the contributions of the transistors T5 and T6. Any noise which may be generated by the transistors T8 and T9 in FIG. 2 will be divided equally among the transistors T5 and T6, producing at the output terminals 3 and 4 a common-mode noise current, which is suppressed.

In order to reduce the disturbing voltage differential-mode noise currents of the transistors T5 and T6 the transistor T8 of FIG. 2 is split into a transistor T8A, in series with the transistor T5, and a transistor T8B, in series with the transistor T6, and the transistor T9 of FIG. 2 is split into a transistor T9A, in series with the transistor T6, and a transistor T9B, in series with the transistor T5. The gates of the two transistors T8A and T8B are connected to the output terminal 3. The gates of the two transistors T9A and T9B are connected to the output terminal 4. The transistors T8A and T8B can be obtained by dividing the original transistor T8 into halves, the resulting transistors each having one half of the original transistor area, but this is not necessary. The same holds for the transistors T9A and T9B. The result of this measure is that the impedance seen by the sources of the transistors T5 and T6 is increased considerably while the effect of the common-mode rejection of the transistors T8 and T9 of FIG. 2 is maintained. When the transistors T8 and T9 are halved the individual transistors T8A, T8B, T9A and T9B will each have a resistance value which is twice as large as the resistance of the original transistors T8 and T9. The resistance of the parallel-connected transistors T8A and T9A is doubled but the current through these transistors is halved, so that the source voltage of the transistor T5 has not changed. The source of the transistor T5 now sees Ro5 plus the parallel resistance of the transistors T8A and T9A, which as already stated can be twice the original parallel resistance of the transistors T8 and T9. Moreover, owing to the absence of the connection between the sources of the transistors T5 and T6, the noise current In5 no longer flows to the transistor T6 via the output resistance Ro6. The effective transconductance of the transistors T5 and T6 has decreased substantially, resulting in a substantial reduction of the differential-mode noise currents in the output terminals 3 and 4.

Figure 4:
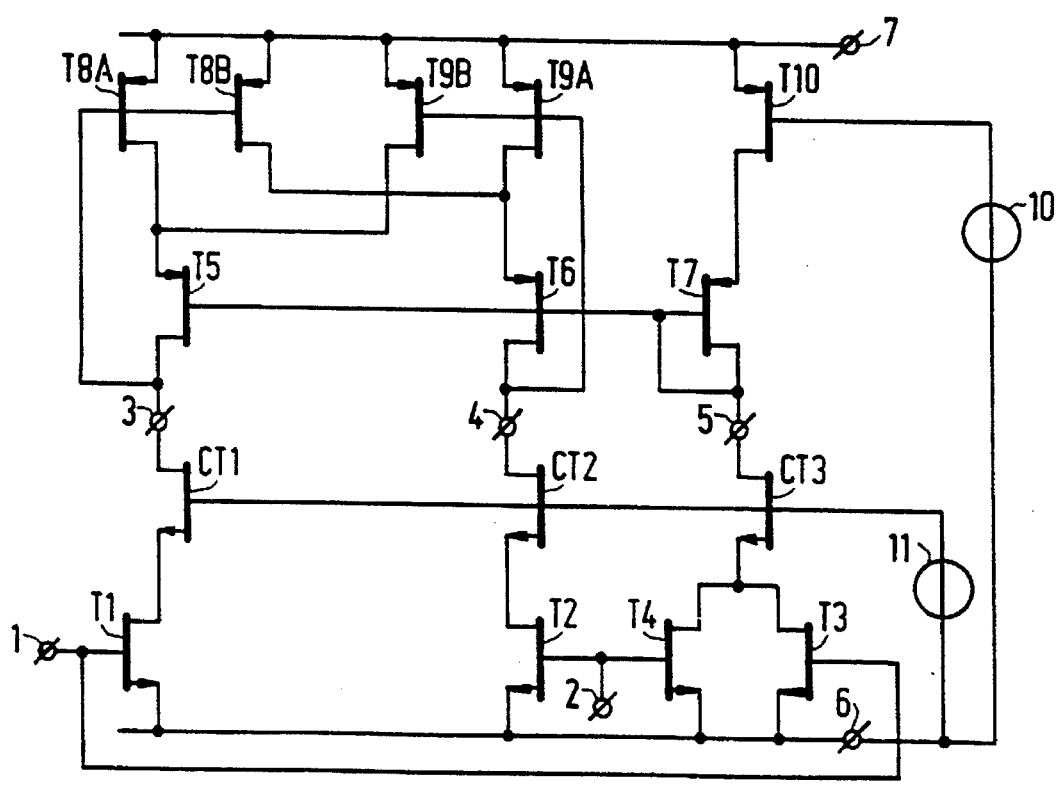
FIG. 4 shows a first linearized differential amplifier in accordance with the invention, comprising MOS transistors.

FIG. 4 shows a linearised differential amplifier in accordance with the invention, comprising MOS transistors. In comparison with FIG. 3, cascode transistors CT1, CT2 and CT3 are added, the drains of the transistors T1, T2, T3 and T4 being coupled, respectively, to the first output terminal 3, the second output terminal 4, the input terminal 5, and again the input terminal 5 of the current mirror via a current path between a first and a second main electrode of a first (CT1), a second (CT2), a third (CT3) and again the third (CT3) cascode transistor, respectively, individual gates of these cascode transistors being coupled to a second reference voltage source 11. By means of the cascode transistors CT1, CT2 and CT3 the drain-source voltages of the transistors T1, T2, T3 and T4 are maintained constant. When the transistors T1, T2, T3 and T4 are operated in their linear regions there will be a linear relationship between the applied gate-source voltage and the drain current of the respective transistor. This relationship is given by:

$$Ids = Kn(Vgs - Vtn - Vds/2) * Vds$$

where:

Ids=drain-source current

Kn=constant of the transistor

Vgs=gate-source voltage

Vtn=threshold voltage

Vds=drain-source voltage

The differential transconductance Sdiff is now given by:

$$Sdiff = [(Ids1 - Ids2)/2]/[V1 - V2] = Kn * Vds/2$$

where:

Ids1=drain-source current of transistor T1

Ids2=drain-source current of transistor T2

V1=gate-source voltage of transistor T1

V2=gate-source voltage of transistor T2

Vds=drain-source voltage of transistors T1 and T2.

Now the reference voltage source 10 is no longer used to adjust the drain-source voltages of the transistors T1 and T2 but to set the d.c. level at the output terminals 3 and 4.

Figure 5:
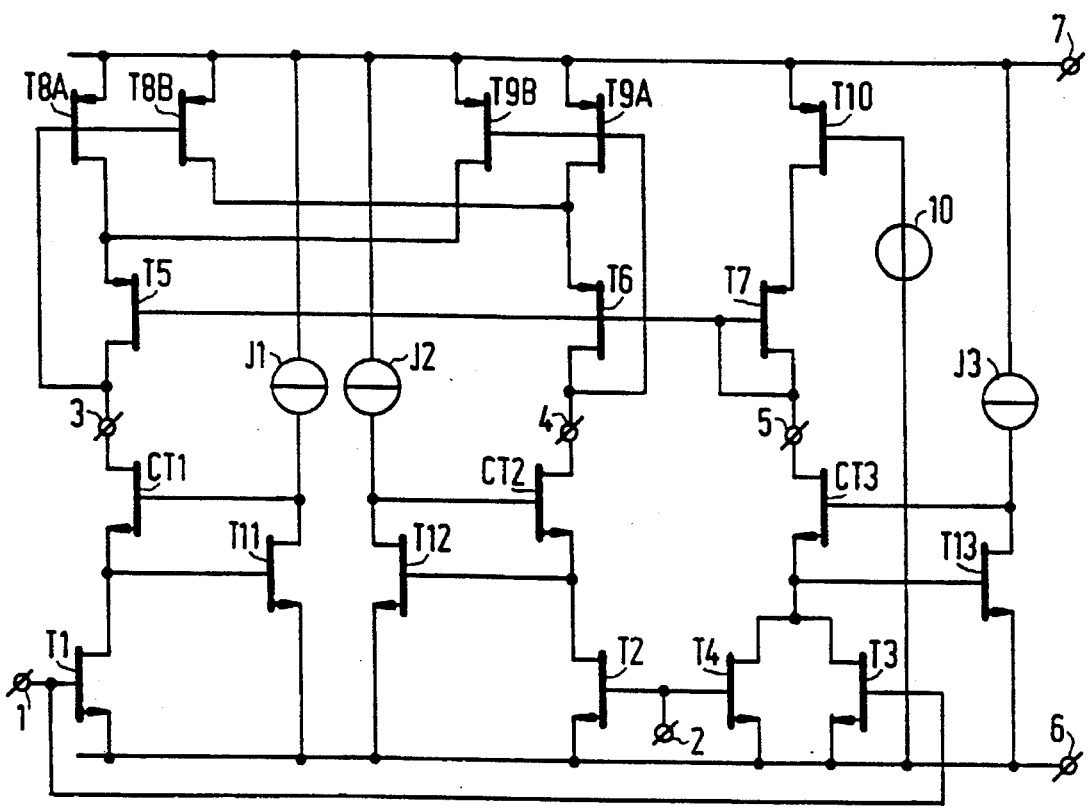
FIG. 5 shows a second linearized differential amplifier in accordance with the invention, comprising MOS transistors.

FIG. 5 shows a second linearised differential amplifier in accordance with the invention, comprising MOS transistors. In comparison with FIG. 4 the gates of the cascode transistors CT1, CT2 and CT3 are no longer interconnected and the second reference voltage source 11 is dispensed with. Added in comparison with FIG. 4 are a first, a second and a third current source J1, J2, J3, which current sources are coupled between the second supply terminal 7 and the gates of the first, the second and the third cascode transistor CT1, CT2 and CT3, respectively. Moreover, the transistors T11, T12 and T13 are added, which transistors have their drains coupled to the gates of the first, the second and the third cascode transistor CT1, CT2 and CT3, respectively, and their source to the first supply terminal 6. The gates of the transistors T11, T12 and T13 are coupled to the sources of the first, the second and the third cascode transistor CT1, CT2 and CT3, respectively. The feedback operates as follows, the transistors T1, T11 and CT1 being taken as examples. If the drain-source voltage of the transistor 1T decreases for a given current through the transistor T1 (and, as a consequence, also through the transistor CT1), the gate voltage of the transistor T11 will also decrease. As a result, the "resistance" of the transistor T11 increases, causing the voltage at the gate of the transistor CT1 to increase. Since the current through the transistor CT1 does not change, the source voltage of transistor CT1 will also increase, as a result of which the drain-source voltage of the transistor T1 increases. This means that the feedback of the gate voltage of the transistor T11 to the gate voltage of the transistor CT1 results in an effective control of the drain-source voltage of the transistor T1, which voltage is thus maintained constant. By maintaining the drain-source voltage of the transistor T1 constant a linear transfer from gate-source voltage to drain current is obtained.

The ratio between input current and output current of the current mirror need not be unity. However, this will have the consequence that the ratio between the currents through the transistors T1 and T2 and the transistors T3 and T4 should be equal to the current ratio in the current mirror. The circuit arrangement shown in FIG. 4 can be further improved by constructing the cascode transistors CT1, CT2 and CT3 and/or the transistors T5, T6 and T7 as bipolar transistors, in which case the base, emitter and collector take the place of the gate, source and drain of the MOS transistors. This has the advantage that a higher output impedance is obtained at the output terminals 3 and 4 and that the supply voltage can be lower because the collector-emitter voltage of a saturated bipolar transistor is generally lower than the drain-source voltage of a saturated MOS transistor. Besides, the voltage drop across the base-emitter junction of a bipolar transistor is generally lower than the gate-source voltage of a MOS transistor, which is important for the transistor T10. Moreover, it is possible to use bipolar transistors for the transistors T1, T2, T3 and T4.

We claim:

1. A differential amplifier with common-mode rejection, comprising: first through fourth transistors each having a first main electrode, a second main electrode and a control electrode, a current mirror having an input terminal, a first output terminal and a second output terminal, wherein:

the first and the third transistor each have their control electrodes coupled to a first input terminal of the differential amplifier, the second and the fourth transistor each have their control electrodes coupled to a second input terminal of the differential amplifier, the first through the fourth transistor have their second main electrodes coupled to a first supply terminal, the first and the second transistor have their first main electrodes coupled, respectively, to the first and the second output terminal of the current mirror, the third and the fourth transistor have their first main electrodes coupled to the input terminal of the current mirror, wherein the current mirror comprises a fifth through tenth transistor each having a first main electrode, a second main electrode and a control electrode, the fifth, the sixth and the seventh transistor having their first main electrodes coupled, respectively, to the first output terminal, the second output terminal and the input terminal of the current mirror, having their second main electrodes coupled to the first main electrodes of the eighth, the ninth and the tenth transistor, respectively, and having their control electrodes coupled to the first main electrode of the seventh transistor, the eighth, the ninth and the tenth transistor have their second main electrodes coupled to a second supply terminal, the eighth and the ninth transistor have their control electrodes coupled, respectively, to the first and the second output terminal of the current mirror, the tenth transistor having its control electrode coupled to a first reference voltage source which generates a first reference voltage, and the eighth transistor has its first main electrode coupled to the first main electrode of the ninth transistor.

2. A differential amplifier with common-mode rejection for low supply voltages, comprising: first through fourth transistors each having a first main electrode, a second main electrode and a control electrode, a current mirror having an input terminal, first output terminal and a second output terminal, wherein:

the first and the third transistor have their respective control electrodes coupled to a first input terminal of the differential amplifier, the second and the fourth transistor have their respective control electrodes coupled to a second input terminal of the differential amplifier, the first through the fourth transistor have their second main electrodes coupled to a first supply terminal, the first and the second transistor have their first main electrodes coupled, respectively, to the first and the second output terminal of the current mirror, which output terminals also form the output terminals of the differential amplifier, the third and the fourth transistor have their first main electrodes coupled to the input terminal of the current mirror, wherein the current mirror comprises a fifth through twelfth transistor each having a first main electrode, a second main electrode and a control electrode, the fifth, the sixth and the seventh transistor having their first main electrodes coupled, respectively, to the first output terminal, the second output terminal and the input terminal of the current mirror, having their second main electrodes coupled to the first main electrodes of the eighth, the ninth and the tenth transistor, respectively, and having their control electrodes coupled to the first main electrode of the seventh transistor, the eighth, the ninth, the tenth, the eleventh and the twelfth transistor have their second main electrodes coupled to a second supply terminal, the eighth and the ninth transistor have their control electrodes coupled, respectively, to the first and the second output terminal of the current mirror, the tenth transistor having its control electrode coupled to a first reference voltage source which generates a first reference voltage, the eleventh and the twelfth transistor having their control electrodes coupled to the control electrodes of the eighth and the ninth transistor, respectively, and the eleventh and the twelfth transistor having their first main electrodes coupled to the second main electrodes of the sixth and the fifth transistor, respectively.

3. A differential amplifier as claimed in claim 2, wherein the eighth, the ninth, the eleventh and the twelfth transistor each have an area substantially equal to half the area of the tenth transistor.

4. A differential amplifier as claimed in claim 2 wherein the third and the fourth transistor each have an area substantially equal to half the area of each of the first and the second transistor.

5. A differential amplifier as claimed in claim 2, wherein the first main electrode of the first transistor is coupled to the first output terminal via a main current path of a first cascode transistor, the first main electrode of the second transistor is coupled to the second output terminal via a main current path of a second cascode transistor, the first main electrodes of the third and the fourth transistor are coupled to the input terminal of the current mirror via a main current path of a third cascode transistor, and means for supplying respective bias voltages to control electrodes of the first, the second and the third cascode transistor.

6. A differential amplifier as claimed in claim 5, wherein the means for supplying respective bias voltages to the control electrodes of the first, the second and the third cascode transistor comprise a second reference voltage source, which coupled to the control electrodes of the first, the second and the third cascode transistor.

7. A differential amplifier as claimed in claim 5, wherein the means for supplying respective bias voltages to the control electrodes of the first, the second and the third cascode transistor comprise a thirteenth, a fourteenth and a fifteenth transistor each having a first main electrode, a second main electrode and a control electrode, and a first, a second and a third current source, the first, the second and the third current source being coupled between the second supply terminal and the control electrodes of the first, the second and the third cascode transistor, respectively, the thirteenth, the fourteenth and the fifteenth transistor having their control electrodes coupled to the second main electrodes of the first, the second and the third cascode transistor, respectively, the thirteenth, the fourteenth and the fifteenth transistor having their first main electrodes coupled to the control electrodes of the first, the second and the third cascode transistor, respectively, and the thirteenth, the fourteenth and the fifteenth transistor have second main electrodes coupled to the first supply terminal.

8. A differential amplifier as claimed in claim 1 wherein the third and the fourth transistor each have an area substantially equal to half the area of each of the first and the second transistor.

9. A differential amplifier as claimed in claim 1 wherein the first main electrode of the first transistor is coupled to the first output terminal via a main current path of a first cascode transistor, the first main electrode of the second transistor is coupled to the second output terminal via a main current path of a second cascode transistor, the first main electrodes of the third and the fourth transistor are coupled to the input terminal of the current mirror via a main current path of a third cascode transistor, and means for supplying respective bias voltages to control electrodes of the first, the second and the third cascode transistor.

10. A differential amplifier as claimed in claim 9, wherein the means for supplying respective bias voltages to the control electrodes of the first, the second and the third cascode transistor comprise a second reference voltage source coupled to the control electrodes of the first, the second and the third cascode transistor.

11. The differential amplifier as claimed in claim 1 wherein the first and second output terminals of the current mirror comprise the output terminals of the differential amplifier, and the second main electrodes of the first through the fourth transistors are directly coupled to the first supply terminal.

* * * * *